United States Patent [19]

Ahmad et al.

[11] Patent Number: 5,382,533
[45] Date of Patent: Jan. 17, 1995

[54] METHOD OF MANUFACTURING SMALL GEOMETRY MOS FIELD-EFFECT TRANSISTORS HAVING IMPROVED BARRIER LAYER TO HOT ELECTRON INJECTION

[75] Inventors: Aftab Ahmad; Randhir P. S. Thakur, both of Boise, Id.

[73] Assignee: Micron Semiconductor, Inc., Boise, Id.

[21] Appl. No.: 79,322

[22] Filed: Jun. 18, 1993

[51] Int. Cl.$^6$ .......................................... H01L 21/265
[52] U.S. Cl. ..................................... 437/24; 437/242; 437/941
[58] Field of Search ..................... 437/24, 41, 44, 235, 437/241, 242, 941, 959; 148/DIG. 40, DIG. 98, DIG. 112, DIG. 114

[56] References Cited

U.S. PATENT DOCUMENTS

| | | | |
|---|---|---|---|
| 4,113,515 | 9/1978 | Kooi et al. | 148/DIG. 112 |
| 5,032,545 | 7/1991 | Doan et al. | 437/242 |
| 5,098,866 | 3/1992 | Clark et al. | 437/941 |
| 5,237,188 | 8/1993 | Iwai et al. | 437/241 |
| 5,258,333 | 11/1993 | Shappir et al. | 437/242 |
| 5,264,380 | 11/1993 | Pfiester | 437/44 |

*Primary Examiner*—Brian E. Hearn
*Assistant Examiner*—Chandra Chaudhari
*Attorney, Agent, or Firm*—Angus C. Fox, III

[57] ABSTRACT

A process for suppressing hot electrons in sub half micron MOS devices wherein a gate oxide and a gate electrode are formed on the surface of a silicon substrate and source and drain regions are ion implanted into the silicon substrate using the gate electrode as a mask. The process includes forming a layer of silicon dioxide over the gate electrode and over the source and drain regions of the substrate, and then introducing a barrier layer forming element into the layer of silicon dioxide to form a thin barrier region to hot electrons at the interface between the silicon substrate and the silicon dioxide. In a preferred embodiment of the invention, nitrogen is introduced into the silicon dioxide by heating the wafer in a rapid thermal processor and in the presence of a nitrogen containing gas at an elevated temperature for a predetermined time. The nitrogen containing gas may be selected from the group consisting of nitrogen trifluoride, ammonia and nitrous oxide. In an alternative embodiment of the invention, fluorine atoms are introduced into the silicon substrate either as the sole barrier layer forming element (silicon fluoride) or prior to the formation of the thin silicon nitride region. The fluorine atoms form good strong silicon-fluorine bonds in the silicon substrate and thereby further enhance the hot electron suppression. In a third embodiment, nitrogen and fluorine are reacted in a rapid thermal processor to form a composite barrier layer of $Si_3N_4$ and SF.

6 Claims, 2 Drawing Sheets

METHOD OF MANUFACTURING SMALL GEOMETRY MOS FIELD-EFFECT TRANSISTORS HAVING IMPROVED BARRIER LAYER TO HOT ELECTRON INJECTION

TECHNICAL FIELD

This invention relates generally to the fabrication of sub half-micron metal-oxide-silicon (MOS) transistors and more particularly to a process for fabricating such devices with improved hot electron suppression characteristics.

BACKGROUND ART

In the manufacture of high density integrated circuits, and particularly when MOS devices therein are scaled down to deep submicron design rules, the problem of hot electron reliability becomes a big concern for device engineers. Hot electron reliability refers to a condition where electrons/hole pairs are generated in a silicon substrate of an MOS transistor as a result of the high electrical fields produced between the gate electrode and the substrate at the edge of the source and drain regions. After generation, these hot electrons move swiftly toward the oxide-silicon interface and gain enough energy to surmount the silicon-silicon dioxide barrier and get trapped into the oxide. This entrapment in turn causes an increase of threshold voltage over time, thereby resulting in a significant long term reliability problem.

One of the techniques used to reduce the maximum vertical electrical field at the edge of gate electrode is to create a so-called gate bird beak region by the re-oxidation of the polysilicon gate and the adjacent source and drain regions of the MOS transistor. This process reduces the maximum vertical electrical field under the gate edge, and in addition, it reduces the gate-to-drain overlap capacitance. However, the gate bird beak encroachment can degrade the transconductance of submicron MOS devices and impact upon their subthreshold swing/threshold voltage.

SUMMARY OF THE INVENTION

The general purpose and principal object of the present invention is to provide a new and improved process for fabricating sub half-micron MOS transistors (also known as insulated-gate, field-effect transistors) having an improved barrier layer to hot electron injection at the bird beak area of the device located between the silicon substrate and the edge of the gate electrode.

Another object of this invention is to provide a new and improved process of the type described capable of producing improved long term hot electron reliability in submicron NMOS devices by the use of re-oxidized nitrided oxide (RNO) treatment on the polysilicon sidewall oxide and at the gate bird beak of these devices.

Another object of this invention is to provide a new and improved NMOS transistor of the type described having improved hot carrier injection due to drain avalanche at the gate edge, without degrading both the resistance against the electron-hole injection in the silicon substrate and the carrier mobility therein.

A further object of this invention is to provide a new and improved process of the type described which does not degrade transconductance of submicron NMOS devices.

Another object of this invention is to provide new and improved NMOS devices of the type described whose gate-to-drain overlap capacitance is also reduced due to the gate bird beak region which has thicker oxide at the edges than prior art NMOS devices.

To accomplish the above purpose, various objects, advantages and other novel features of the invention, there is provided a process for forming NMOS transistors wherein a thin gate oxide and a gate electrode are initially formed on the surface of a silicon substrate, and source and drain regions of the transistor are ion implanted into the silicon substrate using the gate electrode as a mask to prevent the implantation of ionic species in the transistor's channel region. The present process is characterized by the steps of forming a layer of silicon dioxide over the gate electrode and over the source and drain regions, and then introducing nitrogen into the layer of silicon dioxide formed over the gate electrode to thereby form a thin layer of silicon nitride, $Si_3N_4$, at the silicon dioxide/silicon substrate interface. In a preferred embodiment of the invention, the nitrogen is introduced into the silicon dioxide layer by heating the wafer in a rapid thermal processor (RTP) and in the presence of a chosen nitrogen-containing gas at a predetermined elevated temperature for a predetermined time. The nitrogen containing gas can be selected from the group consisting of nitrogen trifluoride, ($NF_3$), ammonia, ($NH_3$), and nitrous oxide, ($N_2O$), and the wafers are retained in the rapid thermal processor for at least 10 seconds and heated to a temperature of at least 800° C.

In accordance with a preferred device embodiment of the invention, there is provided a MOS transistor having a thin gate oxide and a gate electrode formed on the surface of a silicon substrate and source and drain regions implanted into the silicon substrate on each side of the gate electrode. This device includes in combination: (1) a layer of silicon dioxide formed over the gate electrode and over the source and drain regions, and (2) a thin layer of silicon nitride formed at the interface between the silicon substrate and the silicon dioxide thereover. This thin layer of silicon nitride increases the resistance of the barrier layer to hot electrons between the edge of the gate electrode and the silicon substrate, thereby enhancing hot electron suppression in the transistor and improving its reliability.

In accordance with an alternative, second embodiment of this invention, the above thin layer of silicon nitride may be replaced with silicon fluoride, SF, by either implanting fluorine ions into the surface of the silicon substrate at relatively low ion acceleration voltages on the order of 15–20 KeV or by the use of the gas phase reactions given in the equations below in a rapid thermal processor.

In accordance with yet a third embodiment of this invention, the barrier layer created at the edge of the source and drain regions and beneath the edge of the gate electrode may be a combination of silicon nitride and silicon fluoride by combining the processes of the above two described embodiments in accordance with equations given below. Alternatively, fluorine ions may be implanted into the silicon substrate prior to the formation of the silicon nitride barrier layer therein. In this manner, a thin composite barrier layer of $Si_3N_4$ and SF components is formed at the surface having both the silicon substrate.

The above brief summary of the invention will become better understood with reference to the following description of the accompanying drawings.

DETAILED DESCRIPTION OF THE DRAWINGS

Figure 1:
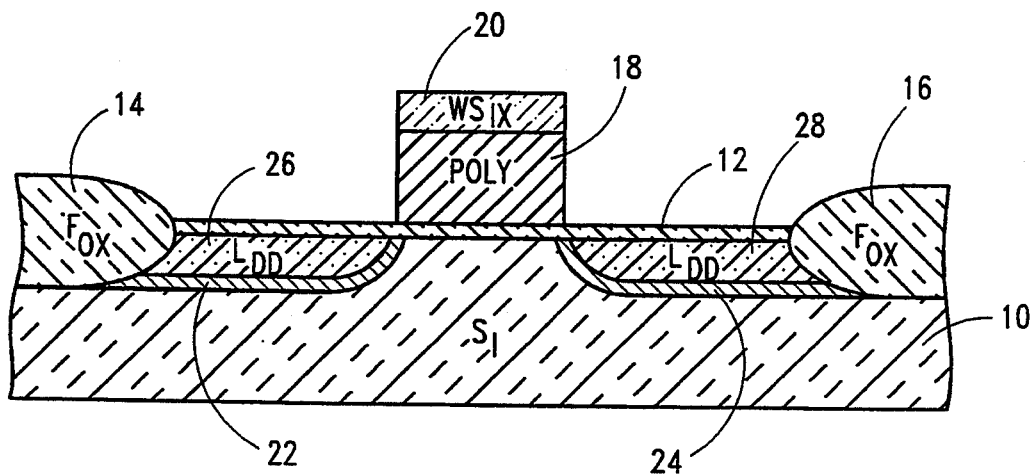
FIGS. 1 through 4 are a sequence of schematic cross section diagrams which illustrate the re-oxidized nitrided oxide (RNO) process in accordance with the present invention.

Referring now FIG. 1, there is shown a silicon substrate 10 upon which a thin gate oxide 12 of about 40 angstroms or greater is grown and is surrounded by thicker field oxide regions 14 and 16. A polycrystalline silicon (polysilicon) gate 18 is formed to a thickness of about 1500 angstroms in the geometry shown and is covered by a thin metal silicide layer 20, such as tungsten silicide, $WSi_x$, or titanium silicide of a thickness of about 800 angstroms. With the polysilicon gate 18 and the tungsten silicide gate electrode 20 in place to serve as an ion implantation mask, the P-type boron halo implants 22 and 24 are formed beneath the to-be-formed source and drain regions to prevent punch through beneath the gate electrode, and the lightly doped drain implants (LDD) for the source and drain regions 26 and 28 are implanted to a more shallow depth of about 0.1 micron.

The structure in FIG. 1 is then heated to an elevated temperature of at least 900° C. in an oxygen ambient and in a furnace where a layer 30 of silicon dioxide is thermally grown over the entire surface of the structure and to a thickness of about 20–25 angstroms, thereby forming gate bird beak regions 32 and 34 at the lowermost areas of the polysilicon gate 18. These bird beak regions in the polysilicon gate 18 are rounded in the shape shown and lifted up by the oxide layer 30 during the thermal growth of this oxide layer to thereby effectively decrease the electric field strength at the edges of the regions 32 and 34.

Figure 2:
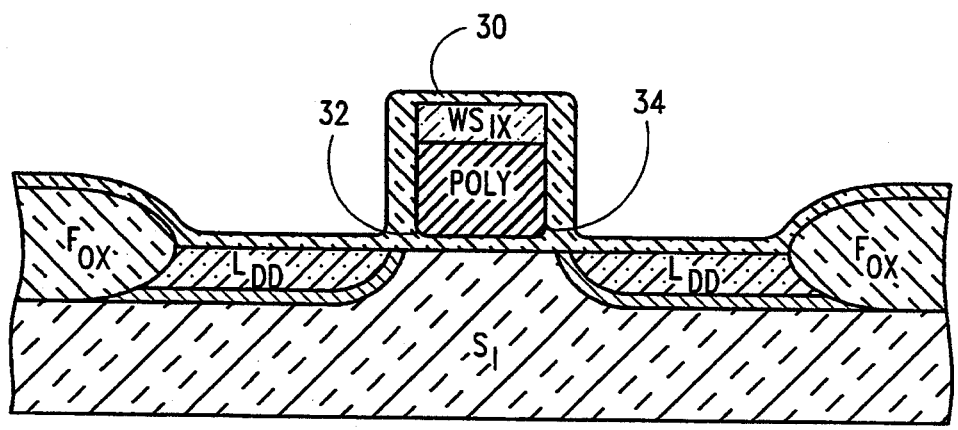
Figure 3:
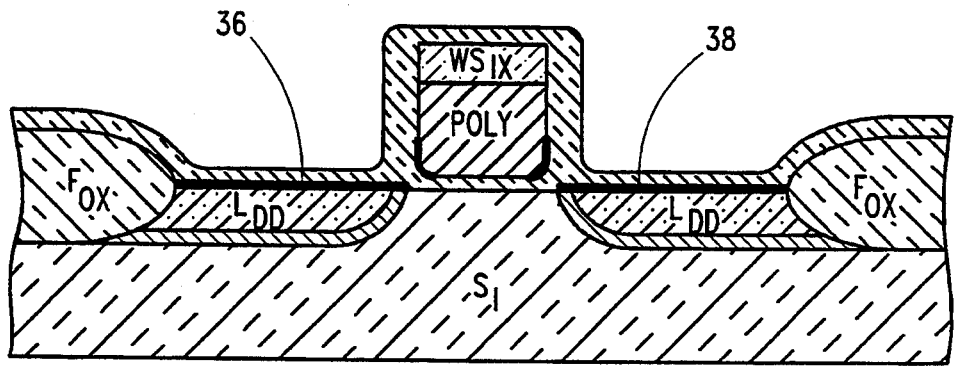

The structure in FIG. 2 is then transferred to a rapid thermal processor and heated in the presence of a nitrogen-containing gas and at an elevated temperature for a predetermined time to thereby form thin silicon nitride regions 36 and 38 at the silicon substrate-$SiO_2$ interface as shown in FIG. 3. These thin silicon nitride regions 36 and 38 are particularly useful in suppressing hot electron injection in the region of the structure just beneath the bird beak regions 32 and 34 at the lower edge of the gate electrode 18.

A maximum temperature of 1150° C. will correspond to a minimum time of 10 seconds in the rapid thermal processor, whereas a minimum temperature of 900° C. will correspond to a maximum time in the rapid thermal processor of 60 seconds. Rapid thermal processors of the type used in carrying out the present invention are generally well known in the art and are disclosed, for example, in U.S. Pat. No. 5,032,545 issued to Trung T. Doan, assigned to the present assignee and incorporated herein by reference. The rapid thermal processor may be operated using either nitrogen trifluoride, ammonia, or nitrous oxide, and the following chemical reactions will apply to the use of each of these nitrogen containing gases:

1. $3Si + 4NH_3 \xrightarrow{\geq 800° C.} Si_3N_4 + 6H_2$

2. $3Si + 4NF_3 \xrightarrow{\geq 800° C.} Si_3N_4 + 6F_2$

3. $3Si + 2N_2O \xrightarrow{\geq 800° C.} Si_3N_4 + O_2$

Using any one of the above reactions, the nitrogen-containing gases will penetrate the thin oxide layer 30 and cause the nitrogen atoms therein to react with the silicon at the silicon-silicon dioxide interface and thereby form the very thin regions 36 and 38 of silicon nitride to a thickness of about eight (8) angstroms.

Figure 4:
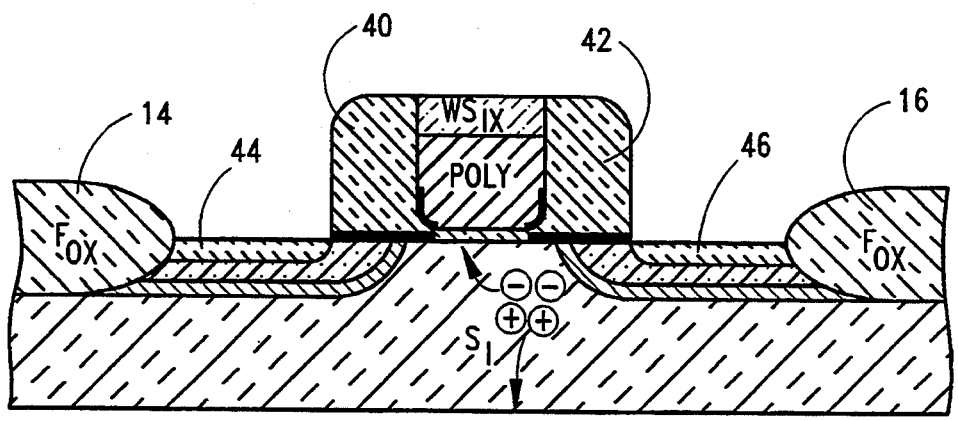

Referring now to FIG. 4, after the structure of FIG. 3 has been removed from the rapid thermal processor, a spacer oxide 40 and 42 is formed on each side of the gate electrode in a well known manner. This is done by first depositing a thick layer (not shown) of $SiO_2$ over the entire upper surface of the structure shown in FIG. 3 and then etching this oxide layer using either plasma etching or reactive ion etching techniques until the surface of the silicon substrate 10 is reached. This etching step will simultaneously remove the oxide covering the tungsten silicide gate region 20, thereby leaving the spacer regions 40 and 42 contoured in the geometry shown. These spacer oxide regions 40 and 42, together with the adjacent field oxide regions 14 and 16, serve as a mask for the heavily doped N+ source and drain implants 44 and 46 which are needed for making good ohmic contact to surface conductors which are subsequently formed on the surfaces of these devices.

In accordance with a second embodiment of the invention, the above described silicon nitride barrier layer is replaced by a barrier layer of only silicon fluoride, SF. This is done either by implanting fluorine ions into the surface of the silicon substrate 10 at relatively low ion implantation voltages on the order of 15–20 KeV or by the use of a rapid thermal processor and the following reactions:

4. $Si + 2NF_3 + O_2 \xrightarrow{\geq 800° C.} SiO_2 + N_2 + 3F_2$

5. $Si + 2NF_3 + N_2O \xrightarrow{\geq 800° C.} SiO_2 + 3N_2 + 3F_2$

In yet a third embodiment of the invention, fluorine ions may be implanted through the thin gate oxide layer 12 and into the surface of FIG. 1 prior to the formation of the $Si_3N_4$ barrier layer and prior to the thermal oxidation of the surface thereof to form the oxide layer 30 as shown in FIG. 2. The fluorine ions form a good strong bond with the silicon atom and this has the effect of causing the subsequently formed $Si_3N_4$ regions 36 and 38 in FIG. 3 to form to a greater thickness than would otherwise be the case.

Alternatively, it is possible to form a composite barrier layer of SiF and $Si_3N_4$ at the surface of the silicon substrate by the use of the gaseous reactions wherein two or more of the nitrogen-containing gases are combined in a single reaction in a rapid thermal processor. For example, it is possible to react $NF_3$ and $N_2O$ with silicon in the rapid thermal processor and thereby obtain $Si_3N_4$, $O_2$ and $F_2$ in accordance with the following equations to thereby obtain a composite barrier layer of $Si_3N_4$ and SF:

6. $6Si + 4NF_3 + 2N_2O \xrightarrow{\geq 800° C.} 2Si_3N_4 + O_2 + 6F_2$

6. $4Si + 2NF_3 + 2N_2O \xrightarrow{>800°\ C.} Si_3N_4 + SiO_2 + 3F_2 + N_2$

In the case of the formation of the barrier layer with rapid thermal processing, the reactant gases diffuse through the thick silicon dioxide layer and react upon reaching the underlying silicon to form the desired silicon nitride or silicon fluoride.

Various modifications may be made in and to the above described embodiments without departing from the spirit and scope of this invention. For example, other nitrogen-containing gases other than those specified above, together with other times and temperatures may be utilized in the nitride barrier forming process. Also, although the processes described herein are preferred for use on NMOS devices, they can be applicable to PMOS devices as well. Accordingly, these and other process variations are within the scope of the following appended claims.

We claim:

1. A process for manufacturing an insulated-gate, field-effect transistor of the type having a gate oxide layer formed on a silicon substrate, a gate electrode formed on top of the gate oxide layer, and a channel region that was masked by the gate electrode during the implantation of ionic species into the transistor's source and drain regions, said process characterized by the following sequence of steps:
   (a) forming a silicon dioxide layer over said gate electrode and over said source and drain regions; and
   (b) introducing fluorine, or fluorine in combination with nitrogen into the surface of the silicon substrate, so as to form a barrier layer comprising either silicon fluoride or both silicon fluoride and silicon nitride components at an interface between the silicon dioxide layer and the silicon substrate, said fluorine being implanted in ionic form into the surface of the silicon substrate with implantation energies in the range of 15-30 Kev.

2. The process of claim 1, wherein the fluorine which is incorporated in the barrier layer comprising both silicon fluoride and silicon nitride components is implanted in ionic form into the surface of the silicon substrate prior to the formation therein of the silicon nitride component.

3. The process of claim 1 wherein said silicon nitride component and said silicon fluoride component of the barrier layer having both silicon fluoride and silicon nitride components are formed separately by diffusion of one or more nitrogen-containing gases into the substrate during one rapid-thermal-processing step, and by diffusion of one or more fluorine-containing gases into the substrate during another rapid-thermal-processing step.

4. The process of claim 1 wherein said silicon nitride component and said silicon fluoride component of the barrier layer having both silicon nitride and silicon fluoride components are formed jointly and simultaneously by diffusion of one or more nitrogen-containing gases and one or more fluorine gases into the substrate during a single rapid-thermal-processing step.

5. A process for manufacturing a sub-half-micron, insulated-gate, field-effect transistor, wherein a gate oxide layer is formed on a silicon substrate, a gate electrode is formed on top of the gate oxide layer, and the gate electrode masks the transistor's channel region when ions are implanted into the substrate in the transistor's source and drain regions, said process characterized by the following sequence of steps:
   (a) forming a silicon dioxide layer over said gate electrode and over said source and drain regions;
   (b) implanting fluorine atoms into said silicon substrate;
   (c) introducing nitrogen into said silicon dioxide layer to form a thin layer of silicon nitride at the interface between said silicon dioxide layer and said silicon substrate.

6. A process for manufacturing an insulated-gate field-effect transistor, said process comprising the following sequence of steps:
   (a) forming a thin gate oxide layer on the surface of a silicon substrate;
   (b) forming a composite gate electrode on the surface of the gate oxide layer, said electrode having a lower layer of polycrystalline silicon and an upper layer of refractory metal silicide;
   (c) implanting ions into the transistor's source and drain regions, said ions being prevented from entering the transistor's channel region by said gate electrode which acts as an implant mask;
   (d) forming a silicon dioxide layer over said gate electrode and over said source and drain regions;
   (e) implanting fluorine ions into said silicon substrate;
   (f) introducing nitrogen into said silicon dioxide layer by heating said wafer to a temperature of at least 800° C. for at least 10 seconds in a rapid thermal processor in the presence of a nitrogen-containing gas selected from the group consisting of nitrogen trifluoride, ammonia, and nitrous oxide, and thus forming a thin layer of silicon nitride at the interface between said silicon dioxide layer and said silicon substrate.

* * * * *